United States Patent
Chen et al.

(10) Patent No.: US 9,659,914 B2
(45) Date of Patent: May 23, 2017

(54) LIGHT-EMITTING DIODE CHIP PACKAGE (71) Applicant: LEXTAR ELECTRONICS CORPORATION, Hsinchu (TW)

(72) Inventors: Yi-Jyun Chen, Chiayi County (TW); Chih-Hao Lin, Taipei (TW); Hsin-Lun Su, Chiayi County (TW); Fang-Chang Hsueh, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/819,355

(22) Filed: Aug. 5, 2015

(65) Prior Publication Data
US 2016/0247787 A1 Aug. 25, 2016

(30) Foreign Application Priority Data
Feb. 25, 2015 (TW) .............................. 104105987 A (51) Int. Cl.
*H01L 29/18* (2006.01)
*H01L 33/00* (2010.01)
*H01L 25/075* (2006.01)
*H01L 23/498* (2006.01)
*H01L 27/15* (2006.01)
*H01L 33/50* (2010.01)
*H01L 33/62* (2010.01)
*H01L 33/44* (2010.01)

(52) U.S. Cl.
CPC .... *H01L 25/0753* (2013.01); *H01L 23/49811* (2013.01); *H01L 23/49827* (2013.01); *H01L 23/49838* (2013.01); *H01L 25/075* (2013.01); *H01L 27/15* (2013.01); *H01L 27/153* (2013.01); *H01L 33/44* (2013.01); *H01L 33/502* (2013.01); *H01L 33/505* (2013.01); *H01L 33/62* (2013.01)

(58) Field of Classification Search
CPC ..... H01L 25/075; H01L 33/62; H01L 27/153; H01L 33/505; H01L 23/49827; H01L 27/15; H01L 23/49811; H01L 23/49838
See application file for complete search history.

(56) References Cited

U.S. PATENT DOCUMENTS

| 7,709,849 | B1 | 5/2010 | Kal et al. |
| 8,646,956 | B2 | 2/2014 | Hering et al. |
| 2004/0208210 | A1* | 10/2004 | Inoguchi ............ H01L 25/0753 372/36 |

(Continued)

FOREIGN PATENT DOCUMENTS

| JP | 2007-529105 | 10/2007 |
| JP | 2010-263174 | 11/2010 |
| WO | WO 2015/004577 A1 | 1/2015 |

OTHER PUBLICATIONS

European Patent Office, Search Report, Application Serial No. 15192890.0, Mar. 30, 2016, Europe.

(Continued)

*Primary Examiner* — Victor A Mandala (57) ABSTRACT

A light-emitting diode chip package is provided. The light-emitting diode chip package includes a substrate; a light-emitting diode chip set (LED chip set) disposed over the substrate, wherein the LED chip set is formed by a plurality of light-emitting diode chips (LED chips) in one piece; and at least two electrodes disposed over the substrate and electrically connected to the LED chip set.

30 Claims, 11 Drawing Sheets (56) References Cited

U.S. PATENT DOCUMENTS

| | | | |
|---|---|---|---|
| 2005/0254243 A1 | 11/2005 | Jiang et al. | |
| 2006/0243999 A1* | 11/2006 | Shen | H01L 25/0756 257/99 |
| 2008/0116466 A1* | 5/2008 | Chen | H01L 25/0753 257/88 |
| 2009/0008656 A1* | 1/2009 | Wang | H01L 33/483 257/91 |
| 2012/0049213 A1* | 3/2012 | Chen | H01L 25/0753 257/89 |
| 2013/0020595 A1* | 1/2013 | Moriguchi | H01L 24/97 257/89 |
| 2014/0085884 A1* | 3/2014 | Horio | H01L 25/0753 362/235 |
| 2014/0177206 A1* | 6/2014 | Sheu | H01L 25/0753 362/97.1 |
| 2014/0203306 A1* | 7/2014 | Ito | H01L 33/44 257/88 |
| 2015/0279822 A1* | 10/2015 | Hsu | H01L 25/0753 257/89 |
| 2016/0003419 A1* | 1/2016 | Chen | H01L 25/0753 362/294 |
| 2016/0208987 A1* | 7/2016 | McGowan | H05K 1/05 |

OTHER PUBLICATIONS

Japan Patent Office, Office Action, Patent Application Serial No. 2015-252635, Sep. 8, 2016, Japan.

* cited by examiner

LIGHT-EMITTING DIODE CHIP PACKAGE

CROSS REFERENCE TO RELATED APPLICATIONS

This application claims priority of Taiwan Patent Application No. 104105987, filed on Feb. 25, 2015, the entirety of which is incorporated by reference herein.

BACKGROUND

Technical Field

The disclosure relates to a chip package, and in particular to a light-emitting diode chip package.

Description of the Related Art

A light-emitting diode is formed by forming an active layer over a substrate and depositing different conductive and semi-conductive layers over the substrate. The recombination radiation of electron and hole may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors. In addition, electromagnetic radiation in the non-visible region may be transferred to visible light through phosphorous lenses.

Since the light-emitting diode industry has recently tended towards mass production, any increase in the yield of manufacturing light-emitting diodes will reduce costs and result in huge economic benefits. Therefore, a simple method for manufacturing light-emitting diode chip packages that can effectively increase the yield without adding too many manufacturing steps or too much cost is needed.

SUMMARY

The present disclosure provides a light-emitting diode chip package, including: a substrate; a light-emitting diode chip set (LED chip set) disposed over the substrate, wherein the LED chip set is formed by a plurality of light-emitting diode chips (LED chips) in one piece; and at least two electrodes disposed over the substrate and electrically connected to the LED chip set.

The present disclosure also provides a light-emitting diode chip package, including: a substrate; a light-emitting diode chip set (LED chip set) disposed over the substrate, wherein the LED chip set is formed by wafer level chip scale packaging; and at least two electrodes disposed over the substrate and electrically connected to the LED chip set.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The light-emitting diode chip package of the present disclosure and the method for manufacturing this light-emitting diode chip package are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

The present disclosure utilizes a light-emitting diode chip set (LED chip set) formed by a plurality of light-emitting diode chips (LED chips) in one piece to simplify the manufacturing steps and reduce the cost. This LED chip set is also referred to as a wafer level chip scale packaging LED chip set.

Figure 1A:
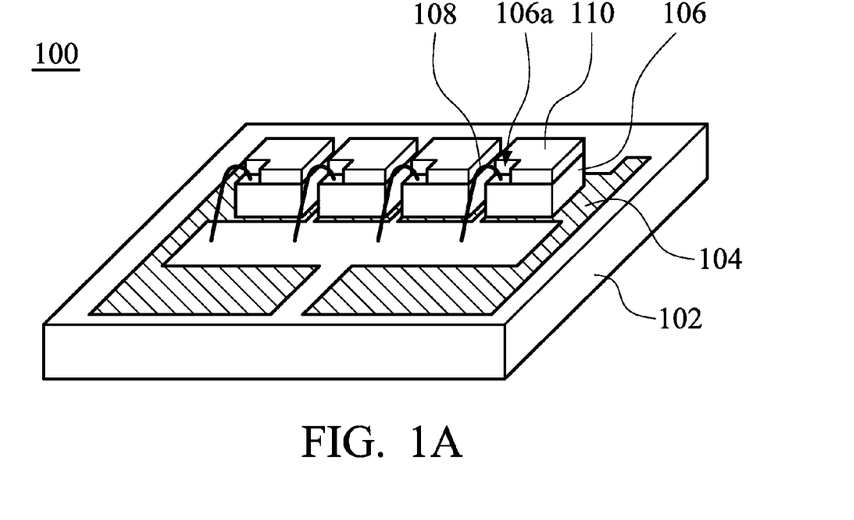
FIGS. 1A-1C are side views of an example light-emitting diode chip package at various manufacturing stages in accordance with some embodiments of the present disclosure.
Figure 1B:
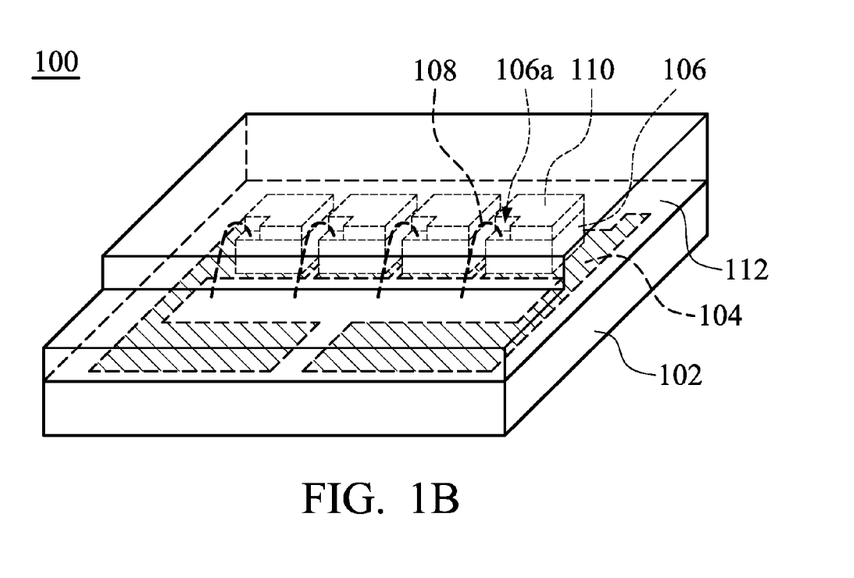
Figure 1C:
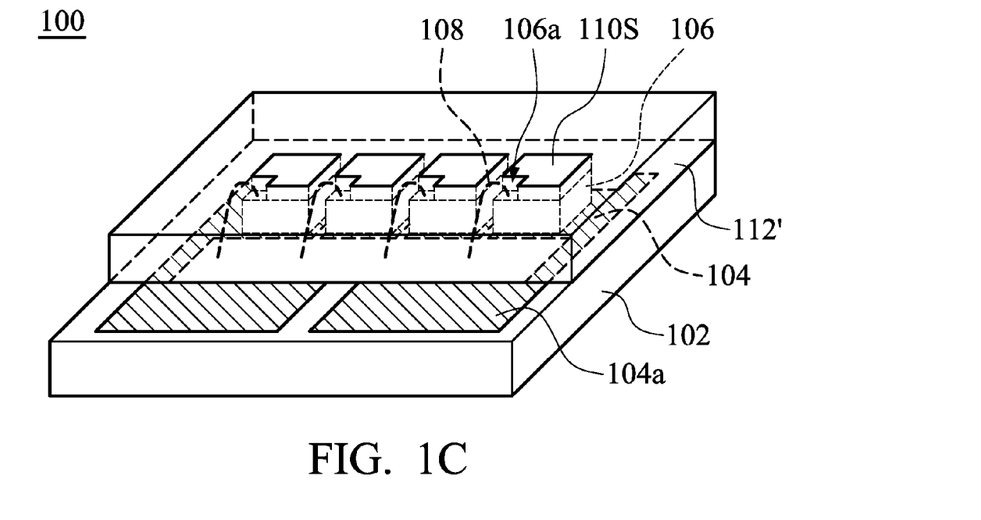

FIGS. 1A-1C are side views of an example light-emitting diode chip package at various manufacturing stages in accordance with some embodiments of the present disclosure. These figures show side views of a light-emitting diode chip package which is known to the inventor. However, the content of these figures is not well-known in the art. Therefore, these figures are merely used as references to clearly describe the problem to be solved in the present disclosure, and are not the prior art of the present disclosure.

First, referring to FIG. 1A, the light-emitting diode chip package 100 includes a substrate 102, a plane electrode 104 disposed over the substrate 102, and four independent light-emitting diode chips (LED chips) 106. One of the electrodes of the LED chip 106 (for example the positive electrode) is electrically connected to the plane electrode 104, and another one of the electrodes of the LED chip 106 (for example the negative electrode) is electrically connected to the substrate 102 from the bonding region 106a by a wire 108. In addition, the light-emitting diode chip package 100 may further include a plurality of fluorescent sheets 110 disposed over each of the LED chips 106. Every fluorescent sheet 110 has to be cut into a particular shape to expose the underneath bonding region 106a of the LED chips 106.

Next, referring to FIGS. 1B-1C, a shielding layer 112' is formed over the substrate 102. The shielding layer 112' is used to shield the region not designed for light emission in the LED chips 106, namely the four sidewalls of the LED chips 106 in FIG. 1C. The shielding layer 112' exposes the top surface 110S of the fluorescent sheets 110, which is used for light emission, and exposes the portion 104a of the plane electrode 104, which is used to connect to the external element.

The shielding layer 112' may be formed by the steps shown in FIGS. 1B-1C. First, as shown in FIG. 1B, a shielding layer 112 is formed over the substrate 102, plane electrodes 104, LED chips 106 and fluorescent sheets 110. It should be noted that, since the shielding layer 112 has to exposes the top surface 110S of the fluorescent sheets 110, which is used for light emission, and the portion 104a of the plane electrode 104, which is used to connect to the external element, at the same time, the shielding layer 112 has to be formed into a particular shape by a particular mold, so that the thickness of the shielding layer 112 corresponds to the top surface 110S of the fluorescent sheets 110 and the portion 104a of the plane electrode 104. In other words, the region of the shielding layer 112 corresponding to the portion 104a of the plane electrode 104 has a thinner thickness, whereas the region of the shielding layer 112 corresponding to the top surface 110S of the fluorescent sheets 110 has a thicker thickness, as shown in FIG. 1B.

Subsequently, referring to FIG. 1C, the shielding layer 112 is etched by an etching step to exposes the top surface 110S of the fluorescent sheets 110, which is used for light emission, and the portion 104a of the plane electrode 104, which is used to connect to the external element, at the same time. The etching step may include sand blasting or any other suitable etching method. The etched shielding layer 112 is referred to as the shielding layer 112'.

For the light-emitting diode chip package 100, if the gap between the LED chips 106 is too great, the light spot would be resulted. Therefore, in order to prevent this light spot, the LED chips 106 in FIG. 1A have to be closely arranged with high accuracy. For example, the gap between two LED chips 106 is not greater than 100 µm. However, it cost a lot to closely arrange the LED chips 106 with such high accuracy.

In addition, as shown in FIG. 1A, every fluorescent sheet 110 disposed over the LED chips 106 has to be cut into a particular shape to expose the underneath bonding region 106a of the LED chips 106. However, it also costs a lot to cut every fluorescent sheets 110 disposed over the LED chips 106 into particular shapes. In addition, since every LED chip 106 requires one wire 108 to electrically connect the substrate 102, the plurality of wires 108 occupy a large area in the substrate 102, which in turn decreases the usable area of the substrate 102.

Furthermore, since the shielding layer 112 in FIGS. 1B-1C has to be formed into a particular shape by a particular mold, it also costs a lot to form this shielding layer 112.

Therefore, in order to solve the abovementioned problem, another light-emitting diode chip package is provided in another embodiment of the present disclosure. This light-emitting diode chip package may be formed by simplified manufacturing steps, which in turn reduces the cost.

FIGS. 2A-2D are side views or cross-sectional views of an example light-emitting diode chip package at various manufacturing stages in accordance with another embodiment of the present disclosure.

Figure 2A:
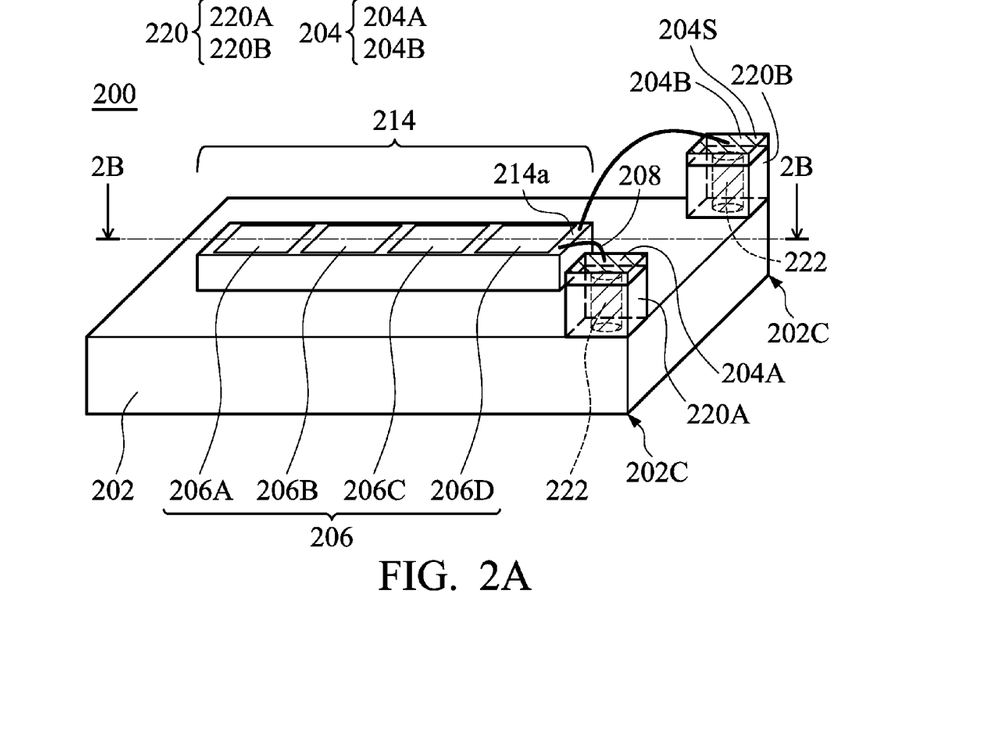
FIGS. 2A-2E are side views or cross-sectional views of an example light-emitting diode chip package at various manufacturing stages in accordance with another embodiment of the present disclosure.

First, referring to FIG. 2A, the light-emitting diode chip package 200 includes a substrate 202, a light-emitting diode chip set 214 (LED chip set 214) disposed over the substrate 202, and at least two electrodes 204A and 204B disposed over the substrate 202 and electrically connected to the LED chip set 214. The substrate 202 may include, but is not limited to, a ceramic substrate, a copper substrate, an aluminum substrate, or any other suitable heat-releasing substrate.

The LED chip set 214 is formed by a plurality of light-emitting diode chips 206A, 206B, 206C and 206D (LED chips 206A, 206B, 206C and 206D) in one piece. Alternately, this LED chip set 214 is also referred to as a wafer level chip scale packaging LED chip set 214. The plurality of light-emitting diode chips 206A, 206B, 206C and 206D may independently include, but are not limited to, an ultraviolet LED chip, a blue LED chip, a green LED chip, a red LED chip, or any other suitable LED chip.

The wafer level chip scale packaging LED chip set 214 formed by the plurality of LED chips 206A, 206B, 206C and 206D is different from the independent light-emitting diode chips formed by conventional chip packaging technology. In particular, the conventional chip packaging technology would perform a cutting step first to separate each of the LED chips formed over the wafer, and then each of the independent LED chips is packaged. Unlike the conventional chip packaging technology, the LED chip set 214 formed by the plurality of LED chips 206A, 206B, 206C and 206D (also referred to as the wafer level chip scale packaging LED chip set 214) is packaged at the wafer level. For example, the plurality of the LED chips in the wafer level chip scale packaging LED chip set 214 are electrically connected to each other in the wafer level. Subsequently, a cutting step is performed to singulate the LED chip set 214 formed by the plurality of LED chips 206A, 206B, 206C and 206D. The semiconductor substrate between the plurality of LED chips 206A, 206B, 206C and 206D, which is used to connect this plurality of LED chips 206A, 206B, 206C and 206D, is not cut.

Figure 2B:
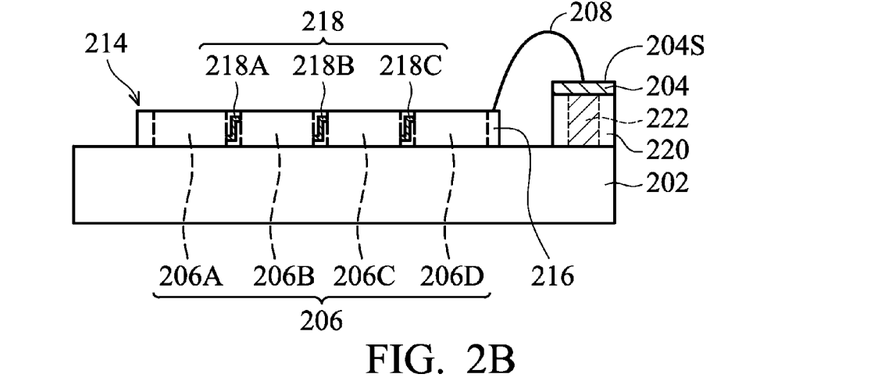

In particular, FIG. 2B is a cross-sectional view along line 2B-2B in FIG. 2A in accordance with some embodiments of the present disclosure. In addition, the electrodes 204, pillar portion 220, conductive via 222 and wire 208 which are not disposed on the line 2B-2B are also shown in FIG. 2B in order to clearly describe the present disclosure.

Using the wafer level chip scale packaging LED chip set 214, which is formed by four light-emitting diode chips 206A, 206B, 206C and 206D in one piece, in FIG. 2B as an example, the four LED chips 206A, 206B, 206C and 206D are electrically connected to each other by the conductive wire structure in the semiconductor substrate 216 of the wafer at the wafer design and wafer manufacture stages. The conductive wire structure 218 may include, but is not limited to, an interconnection structure in the semiconductor substrate 216. Subsequently, a cutting step is performed to singulate the LED chip set 214 formed by these four LED chips 206A, 206B, 206C and 206D. The semiconductor substrate 216 between the plurality of LED chips 206A, 206B, 206C and 206D, which is used to connect this plurality of LED chips 206A, 206B, 206C and 206D, is not cut.

In other words, the LED chip set 214 includes the semiconductor substrate 216, and the plurality of LED chips 206A, 206B, 206C and 206D are disposed in the semiconductor substrate 216 and are electrically connected to each other by a wire structure 218 in the semiconductor substrate 216. For example, in one embodiment as shown in FIG. 2A-2B, one of the electrodes 204 may be electrically connected to the positive electrode of the LED chip 206A through the bonding region 214a of the LED chip set 214 by the wire 208. Then, the negative electrode of the LED chip 206A may be electrically connected to the positive electrode of the LED chip 206B by the wire structure 218A. Subsequently, the negative electrode of the LED chip 206B may be electrically connected to the positive electrode of the LED chip 206C by the wire structure 218B. The negative electrode of the LED chip 206C may be electrically connected to the positive electrode of the LED chip 206D by the wire structure 218C. Finally, the negative electrode of the LED chip 206D may be electrically connected to another electrode 204 through the bonding region 214a and another wire 208.

The semiconductor substrate 216 may include, but is not limited to, a silicon substrate. In addition, the semiconductor substrate 216 may include an element semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof. In addition, the semiconductor substrate 216 may include a semiconductor-on-insulator.

As shown in FIG. 2A-2B, the plurality of light-emitting diode chips 206A, 206B, 206C and 206D in the LED chip set 214 has already been closely arranged with high accuracy. For example, the gap between two LED chips 206 is not greater than 100 μm. Therefore, the manufacturing step for the light-emitting diode chip package 200 need not closely arrange the LED chips, which are separated from each other, with high accuracy as shown in FIG. 1A, and the cost may be greatly reduced. In addition, the light spot issue may be prevented by closely arranging the plurality of light-emitting diode chips 206A, 206B, 206C and 206D.

In addition, in one embodiment as shown in FIG. 2A-2B, the plurality of LED chips 206A, 206B, 206C and 206D of the light-emitting diode chip package 200 is juxtaposed or placed side by side.

Still referring to FIG. 2A-2B, the light-emitting diode chip package 200 may further include at least one pillar portion 220 disposed over the substrate 202. In addition, at least one of the electrodes 204 is disposed over the pillar portion 220. For example, in the embodiment shown in FIG. 2A, the light-emitting diode chip package 200 includes two pillar portions 220A and 220B disposed over the substrate 202, and the two pillar portions 220A and 220B are disposed at two corner regions 202C of the substrate 202. In addition, the two electrodes 204A and 204B are disposed over the top surfaces of these two pillar portions 220A and 220B respectively. The two electrodes 204A and 204B may be electrically connected to the bonding region 214a of the LED chip set 214 by the wire 208.

In addition, each of the pillar portions 220A and 220B includes a conductive via 222, and the conductive via 222 electrically connects the electrode 204 and the substrate 202. In particular, the conductive via 222 is a through hole of the pillar portion 220. This through hole penetrates through the top surface and bottom surface of the pillar portion 220. A conductive material is filled in the conductive via 222. Therefore, the electrodes 204 disposed over the top surface of the pillar portion 220 may be electrically connected to the substrate 202 under the pillar portion 220 by the conductive via 222.

It should be noted that the exemplary embodiment set forth in FIGS. 2A-2B is merely for the purpose of illustration. In addition to the embodiment set forth in FIGS. 2A-2B, the light-emitting diode chip package may include other amount of pillar portions. This will be described in detail in the following description. Therefore, the inventive concept and scope are not limited to the exemplary embodiment shown in FIGS. 2A-2B.

The material of the pillar portion 220 may include, but is not limited to, ceramics, glass, epoxy resin, metal, or any other suitable material. The material of the electrodes 204A and 204B may include, but is not limited to, a single layer or multiple layers of copper, aluminum, tungsten, gold, chromium, nickel, platinum, titanium, iridium, rhodium, an alloy thereof, a combination thereof, or any other metal material with good conductivity. The electrodes 204A and 204B may be formed over the top surface of the pillar portion 220 by electroplating, sputtering, resistive thermal evaporation, electron beam evaporation or any other suitable deposition processes.

In addition, the conductive via 222 of the pillar portion 220 may be formed in the pillar portion 220 by laser cutting, lithography and etching, wheel cutting, mechanical drilling, or a combination thereof, or any other suitable method. The etching step may include sand blasting, reactive ion etching (RIE), plasma etching, or any other suitable etching method. The conductive material disposed in the conductive via 222 may include, but is not limited to, copper, aluminum, tungsten, gold, chromium, nickel, platinum, titanium, iridium, rhodium, an alloy thereof, a combination thereof, or any other metal material with good conductivity. In one embodiment, the conductive material disposed in the conductive via 222 is the same as the material of the electrodes 204A and 204B, and the conductive material and the electrodes 204A and 204B may be formed in the same metal deposition process. However, in other embodiments, the conductive material disposed in the conductive via 222 may be formed in a metal deposition process other than that for forming the electrodes 204A and 204B, and the conductive material may be different from the material of the electrodes 204A and 204B.

Figure 2C:
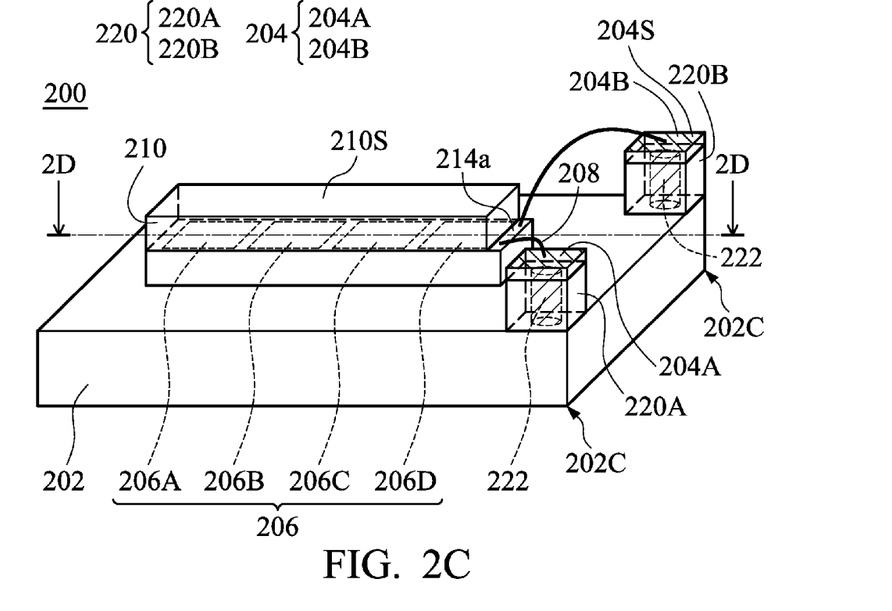
Figure 2D:
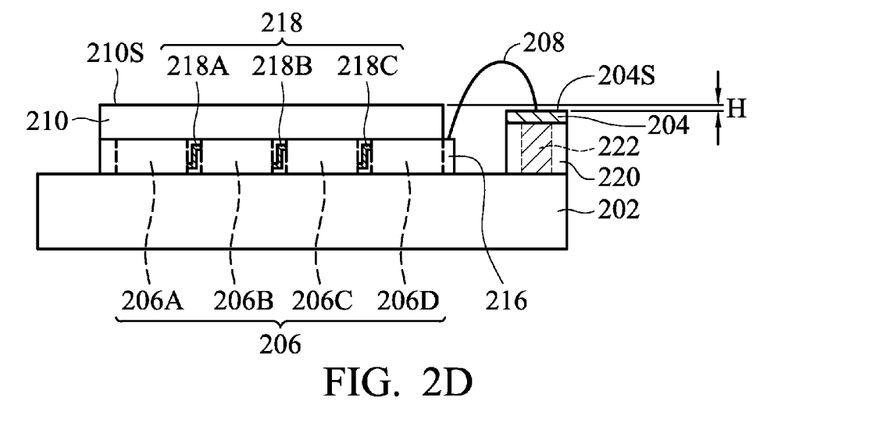

Next, FIG. 2D is a cross-sectional view of the light-emitting diode chip package 200 along line 2D-2D in FIG. 2C in accordance with some embodiments of the present disclosure. In addition, the electrodes 204, pillar portion 220, conductive via 222 and wire 208 which are not disposed on the line 2D-2D is also shown in FIG. 2D in order to clearly describe the present disclosure. As shown in FIGS. 2C-2D, the light-emitting diode chip package 200 may further include a fluorescent sheet 210 disposed over the LED chip set 214.

In some embodiments of the present disclosure, the fluorescent sheet 210 may include, but is not limited to, a fluorescent powder-blended ceramic sheet (referred to as a ceramic fluorescent sheet). The ceramic fluorescent sheet may be formed by sintering the fluorescent powder and the ceramic powder at high temperature. The examples of ceramic powders include silicon oxide, aluminum oxide or any other suitable materials. The examples of fluorescent powders include yttrium aluminium garnet ($Y_3Al_5O_{12}$, YAG), lutetium aluminium garnet ($Lu_3Al_5O_{12}$, LuAG), silicate, nitride or any other suitable fluorescent powder. The fluorescent powders may convert the light emitted by the light-emitting diode chip into white light. In other embodiments, the fluorescent sheet 210 may include, but is not limited to, a glass sheet or a silica gel blended with the fluorescent powder.

As shown in FIGS. 2C-2D, the fluorescent sheet 210 only need to expose the bonding region 214a of the LED chip set 214 at the right side. Therefore, the fluorescent sheet 210 need not be cut into a particular shape to expose every LED chip as shown in FIG. 1A. Therefore, by utilizing the LED chip set 214 of the present disclosure, the complicated cutting process may be simplified, such that the manufacturing steps may be simplified and the cost may be reduced.

In addition, the plurality of light-emitting diode chips 206A, 206B, 206C and 206D need only one wire 208 to electrically connect the electrode 204 through the bonding region 214a of the LED chip set 214. Therefore, compared to the embodiment shown in FIG. 1A, in which each of the LED chips needs one wire, the LED chip set 214 of the present disclosure may greatly reduce the amount of wire 208. Therefore, the area of the substrate 202 occupied by the wire may be greatly reduced, which in turn increases the usable area of the substrate 102.

Figure 2E:
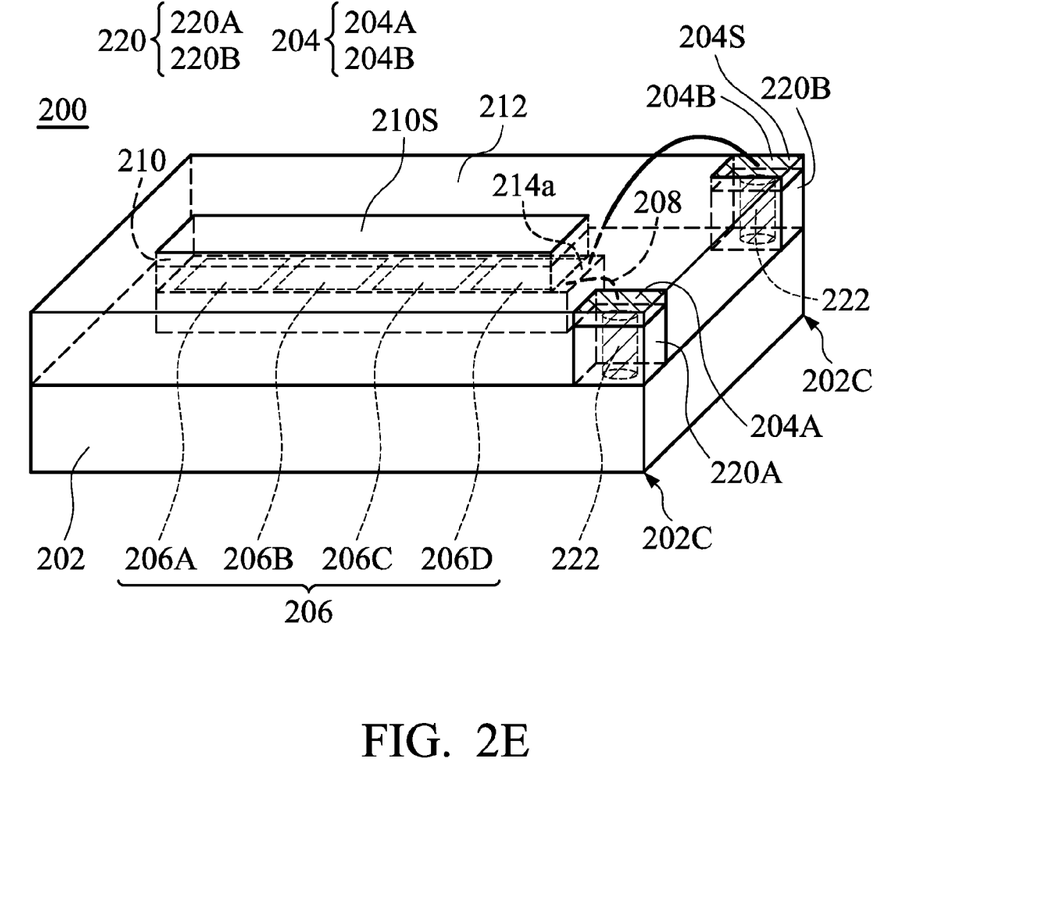

Referring to FIGS. 2D-2E, in one embodiment as shown in FIG. 2D, the height difference H between the top surface 204S of the electrode 204 disposed over the pillar portion 220 and the top surface 210S of the fluorescent sheet 210 may range from about 0 µm to about 50 µm, for example from about 10 µm to about 40 µm. In one embodiment, the height difference H between the top surface 204S of the electrode 204 and the top surface 210S of the fluorescent sheet 210 may be 0. In other words, the height of the top surface 204S of the electrode 204 disposed over the pillar portion 220 is equal to that of the top surface 210S of the fluorescent sheet 210.

Next, in the step shown in FIG. 2E, a shielding layer 212 is formed over the substrate 202. The shielding layer 212 is used to shield the region not designed for light emission in the LED chip set 214, namely the sidewall of the LED chip set 214 in FIG. 2E. The shielding layer 212 exposes the top surface 210S of the fluorescent sheets 210, which is used for light emission, and exposes the top surface 204S of the electrode 204, which is used to connect to the external element.

Since the height difference H between the top surface 204S of the electrode 204 and the top surface 210S of the fluorescent sheet 210 in the light-emitting diode chip package 200 is very small (about 0 µm to about 50 µm), the shielding layer 212 need not be formed into a particular shape by a particular mold as shown in FIGS. 1B-1C. Therefore, by disposing the top surface 204S of the electrode 204 at the same horizontal level as the top surface 210S of the fluorescent sheet 210, namely the height difference is about 0 µm to about 50 µm, the step in which the shielding layer is formed into a particular shape by a particular mold is no longer needed. Therefore, the manufacturing steps may be simplified and the cost may be reduced.

It should be noted that the exemplary embodiment set forth in FIGS. 2A-2E is merely for the purpose of illustration. In addition to the embodiment set forth in FIGS. 2A-2E in which the light-emitting diode chip package includes two pillar portions, the light-emitting diode chip package may include another amount of pillar portions, as shown in the embodiment in FIGS. 3A-3B. This will be described in detail in the following description. Therefore, the inventive concept and scope are not limited to the exemplary embodiment shown in FIGS. 2A-2E.

Figure 3A:
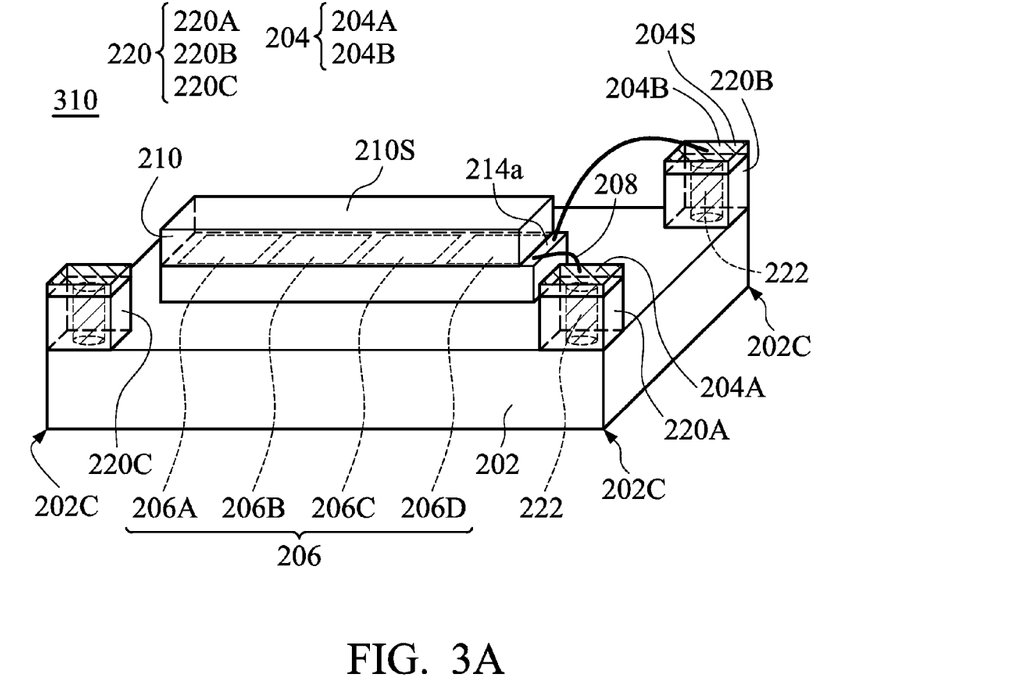
FIG. 3A is a side view of a light-emitting diode chip package in accordance with another embodiment of the present disclosure.

FIG. 3A is a side view of a light-emitting diode chip package in accordance with another embodiment of the present disclosure. The difference between the embodiments shown in FIGS. 3A and 2A-2E is that the light-emitting diode chip package 310 includes three pillar portions 220A, 220B and 220C disposed at three corner regions 202C of the substrate 202. Since the amount of pillar portions 220 that may be used to electrically connect to the external element increases, the light-emitting diode chip package 310 shown in FIG. 3A may improve the device-design flexibility. It should be noted that the shielding layer is not shown in FIG.

3A and the following figures are presented in order to clearly describe the present disclosure.

Figure 3B:
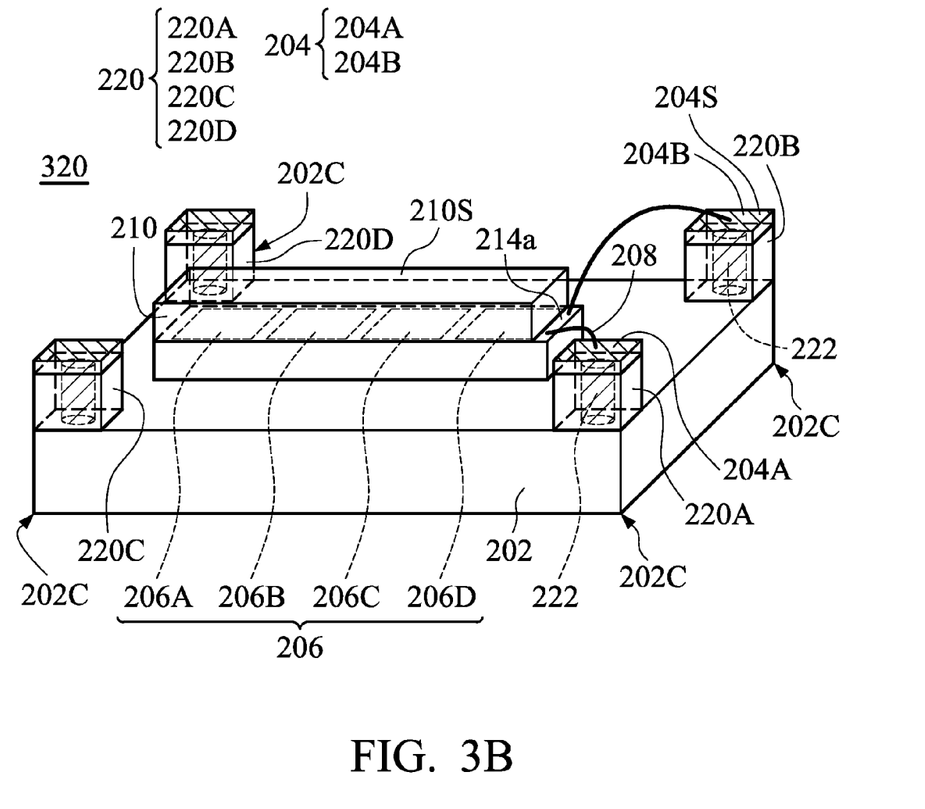
FIG. 3B is a side view of a light-emitting diode chip package in accordance with yet another embodiment of the present disclosure.

FIG. 3B is a side view of a light-emitting diode chip package in accordance with another embodiment of the present disclosure. The difference between the embodiments shown in FIGS. 3B and 3A is that the light-emitting diode chip package 320 includes four pillar portions 220A, 220B, 220C and 220D disposed at four corner regions 202C of the substrate 202. Since the amount of pillar portions 220 that may be used to electrically connect to the external element increases, the light-emitting diode chip package 320 shown in FIG. 3B may improve the device-design flexibility.

It should be noted that the exemplary embodiments set forth in FIGS. 2A-3B is merely for the purpose of illustration. In addition to the embodiments set forth in FIGS. 2A-3B, the electrode of the embodiments of the present disclosure may be electrically connected to the substrate by other methods, as shown in the embodiment in FIG. 3C. This will be described in detail in the following description. Therefore, the inventive concept and scope are not limited to the exemplary embodiments shown in FIGS. 2A-3B.

Figure 3C:
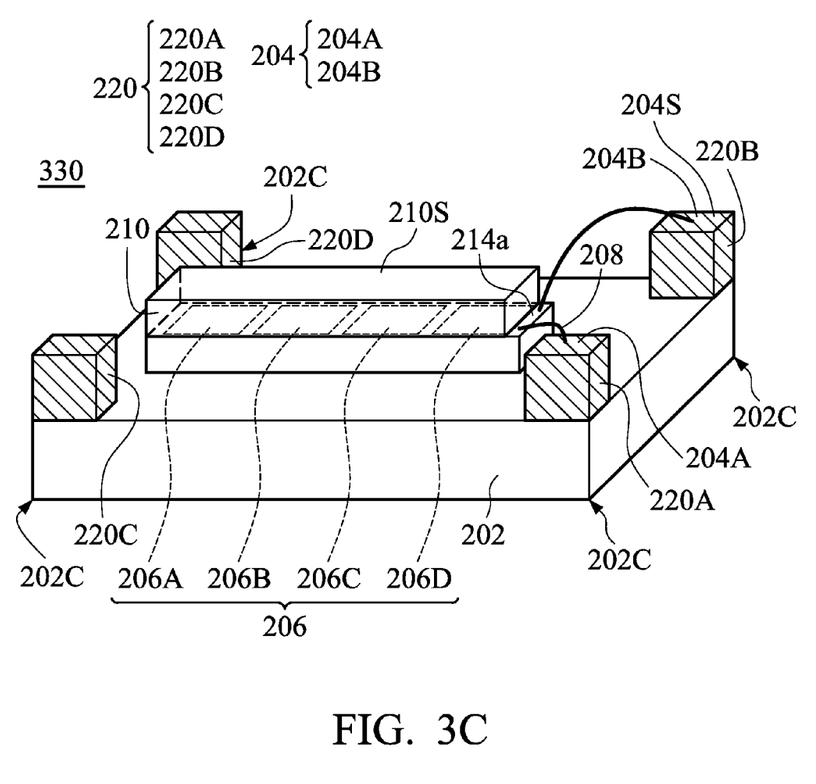
FIG. 3C is a side view of a light-emitting diode chip package in accordance with a further embodiment of the present disclosure.

FIG. 3C is a side view of a light-emitting diode chip package in accordance with another embodiment of the present disclosure. The difference between the embodiments shown in FIGS. 3C and 2A-3B is that the electrode 204 of the light-emitting diode chip package 330 is disposed over the top surface and the sidewall of the pillar portion 220, and the electrode 204 is electrically connected to the substrate 202 through the portion of the electrode 204 disposed over the sidewall of the pillar portion 220. The pillar portion 220 does not include any conductive via. Therefore, the step for forming the conductive via may be eliminated and the cost may be further reduced.

It should be noted that the exemplary embodiments set forth in FIGS. 2A-3C are merely for the purpose of illustration. In addition to the embodiments set forth in FIGS. 2A-3C which include the pillar portion, the present disclosure may include a protrusion portion with other shapes, as shown in the embodiment in FIG. 3D. This will be described in detail in the following description. Therefore, the inventive concept and scope are not limited to the exemplary embodiments shown in FIGS. 2A-3C.

Figure 3D:
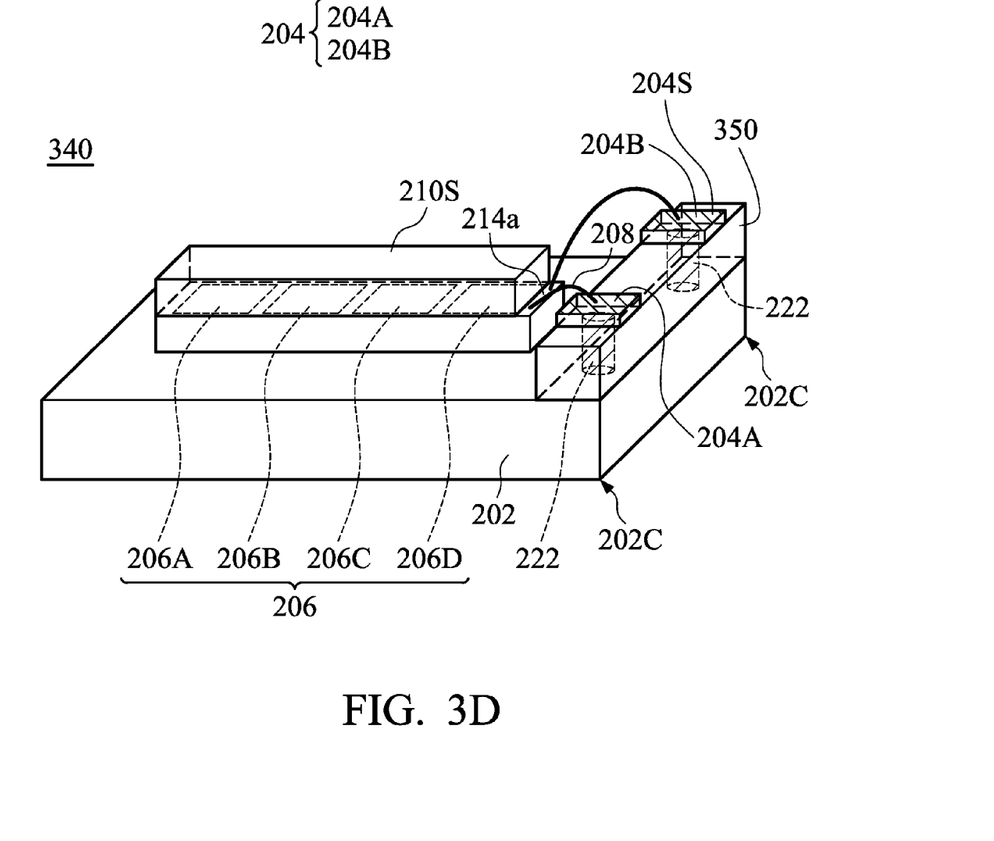
FIG. 3D is a side view of a light-emitting diode chip package in accordance with yet a further embodiment of the present disclosure.

FIG. 3D is a side view of a light-emitting diode chip package in accordance with another embodiment of the present disclosure. The difference between the embodiments shown in FIGS. 3D and 2A-3C is that the light-emitting diode chip package 340 includes a rectangular portion 350 disposed over the substrate 202, and the electrodes 204A and 204B are disposed over the rectangular portion 350. By utilizing the rectangular portion 350, the structure reliability may be further improved.

In addition, the light-emitting diode chip package 340 may further include a fluorescent sheet 210 disposed over the LED chip set 214. The height difference between the top surface of the electrode 204 disposed over the rectangular portion 350 and the top surface of the fluorescent sheet 210 may range from about 0 μm to about 50 μm, for example from about 10 μm to about 40 μm. In one embodiment, the height difference H between the top surface 204S of the electrode 204 and the top surface 210S of the fluorescent sheet 210 may be 0. In other words, the height of the top surface 204S of the electrode 204 disposed over the rectangular portion 350 is equal to that of the top surface 210S of the fluorescent sheet 210.

It should be noted that the exemplary embodiments set forth in FIGS. 2A-3D are merely for the purpose of illustration. In addition to the embodiments set forth in FIGS. 2A-3D which include only one fluorescent sheet, the present disclosure may include a plurality of fluorescent sheets, as shown in the embodiment in FIG. 4. This will be described in detail in the following description. Therefore, the inventive concept and scope are not limited to the exemplary embodiments shown in FIGS. 2A-3D.

Figure 4:
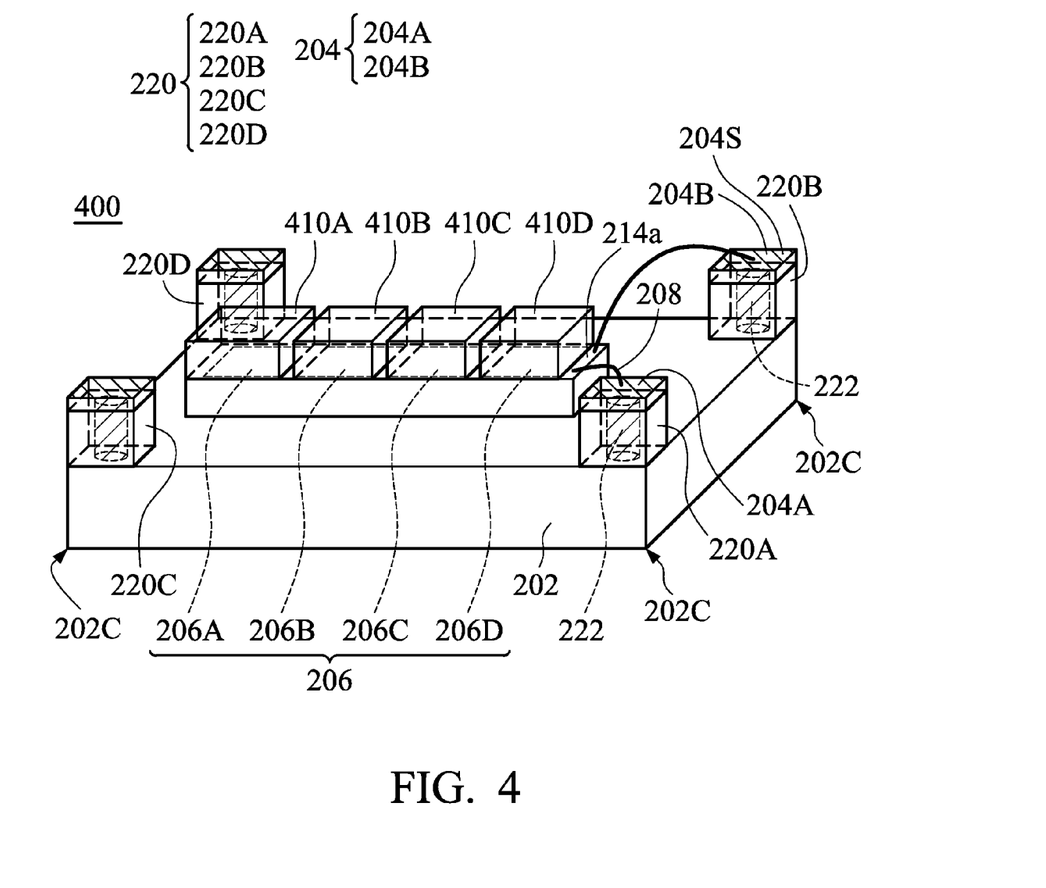
FIG. 4 is a side view of a light-emitting diode chip package in accordance with another embodiment of the present disclosure.

FIG. 4 is a side view of a light-emitting diode chip package in accordance with another embodiment of the present disclosure. The difference between the embodiments shown in FIGS. 4 and 2A-3D is that the light-emitting diode chip package 400 includes a plurality of fluorescent sheets 410A, 410B, 410C and 410D disposed over the LED chip set 214. Each of the fluorescent sheets 410 is disposed corresponding to the plurality of underneath light-emitting diode chips 206A, 206B, 206C and 206D, respectively.

It should be noted that the exemplary embodiments set forth in FIGS. 2A-4 are merely for the purpose of illustration. In addition to the embodiments set forth in FIGS. 2A-4 in which the LED chip set is electrically connected to the electrode by a solid wire, the LED chip set may be electrically connected to the electrode by a conductive layer disposed in or disposed over the substrate.

Figure 5:
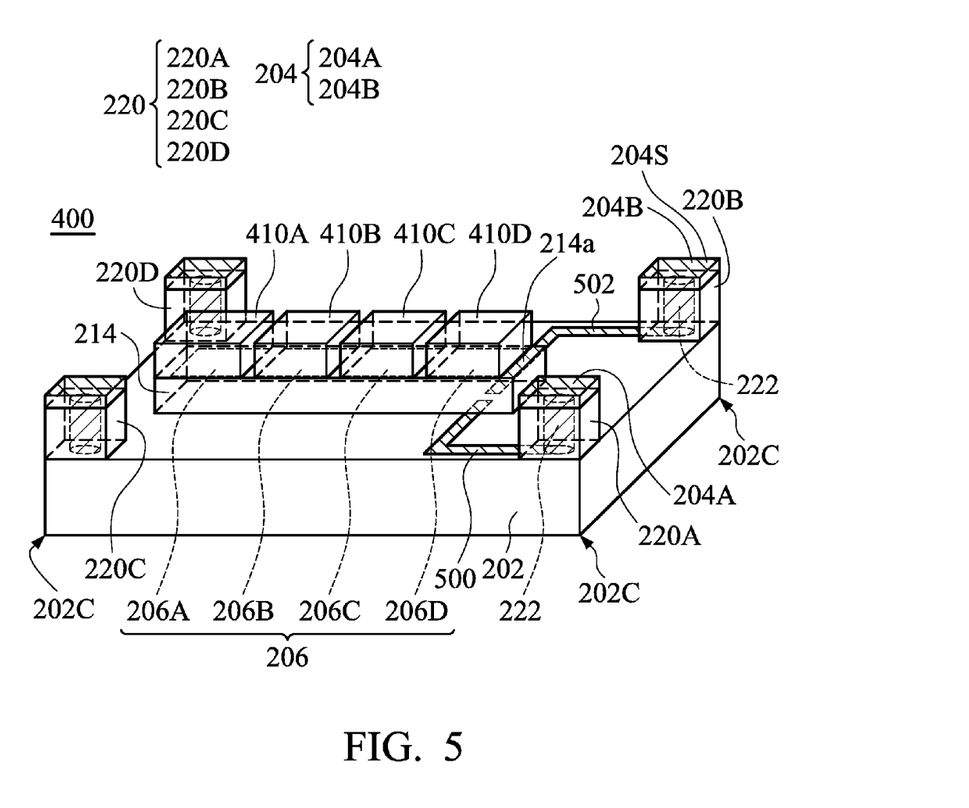
FIG. 5 is a side view of a light-emitting diode chip package in accordance with another embodiment of the present disclosure.

FIG. 5 is a side view of a light-emitting diode chip package in accordance with another embodiment of the present disclosure. As shown in FIG. 5, the LED chip set 214 is electrically connected to the electrode 204A through the conductive via 222 by a conductive layer 500 disposed over the substrate 202, and the LED chip set 214 is electrically connected to the electrode 204B through the conductive via 222 by another conductive layer 502 disposed over the substrate 202. In this embodiment, the LED chip set 214 is not electrically connected to the electrodes 204A and 204B by any solid wire, for example the wire 208 described previously. In addition, although FIG. 5 only shows that the conductive layers 500 and 502 are disposed over the substrate 202, those skilled in the art will appreciate that the conductive layers 500 and 502 may also be disposed in the substrate 202 and may be electrically connected to the LED chip set 214 by a conductive via. The conductive layers 500 and 502 may include, but are not limited to, metal or any other suitable conductive material.

In addition, although the aforementioned embodiments all utilize wires to electrically connect the LED chip set and the electrode, those skilled in the art will appreciate that the LED chip set may be electrically connected to the underneath substrate by a flip-chip arrangement. And the LED chip set may be further electrically connected to the electrode through the interconnection structure in the substrate and the conductive via in the pillar portion. Therefore, the inventive concept and scope are not limited to the exemplary embodiments which utilize the wires.

In summary, by utilizing the light-emitting diode chip set formed by a plurality of LED chips in one piece (namely the wafer level chip scale packaging LED chip set), the manufacturing step for the light-emitting diode chip package need not closely arrange the LED chips which are separated from each other with high accuracy. Therefore, the cost may be greatly reduced. In addition, the area of the substrate occupied by the wire may be greatly reduced, which in turn increases the usable area of the substrate. Furthermore, the fluorescent sheet does not need to be cut by complicated cutting processes. Therefore, the manufacturing steps may be simplified further and the cost may be reduced further. And by disposing the top surface of the electrode at the same horizontal level as the top surface of the fluorescent sheet, the step in which the shielding layer is formed into a particular shape by a particular mold is no longer needed.

Therefore, the manufacturing steps may be simplified further and the cost may be reduced further.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A light-emitting diode chip package, comprising:
    a substrate;
    a light-emitting diode chip set (LED chip set) disposed over the substrate, wherein the LED chip set is formed by a plurality of light-emitting diode chips (LED chips) in one piece, wherein the LED chip set comprises a semiconductor substrate and the plurality of LED chips formed in the semiconductor substrate;
    at least two electrodes disposed over the substrate and electrically connected to the LED chip set; and
    a fluorescent sheet disposed over the LED chip set.

2. The light-emitting diode chip package as claimed in claim 1, wherein the plurality of LED chips are electrically connected to each other by a wire in the semiconductor substrate.

3. The light-emitting diode chip package as claimed in claim 1, wherein the plurality of LED chips are juxtaposed.

4. The light-emitting diode chip package as claimed in claim 1, further comprising:
    at least one pillar portion disposed over the substrate, wherein at least one of the electrodes is disposed over the at least one pillar portion.

5. The light-emitting diode chip package as claimed in claim 4,
    wherein a height difference between a top surface of the electrode disposed over the pillar portion and a top surface of the fluorescent sheet ranges from about 0 μm to about 50 μm.

6. The light-emitting diode chip package as claimed in claim 5, wherein a height of the top surface of the electrode disposed over the pillar portion is equal to that of the top surface of the fluorescent sheet.

7. The light-emitting diode chip package as claimed in claim 4, wherein each of the pillar portions comprises a conductive via, wherein the conductive via electrically connects the electrode and the substrate.

8. The light-emitting diode chip package as claimed in claim 7, wherein the LED chip set is electrically connected to the at least two electrodes by a conductive layer disposed in or disposed over the substrate.

9. The light-emitting diode chip package as claimed in claim 4, wherein the LED chip set is electrically connected to the at least two electrodes by a solid wire.

10. The light-emitting diode chip package as claimed in claim 4, wherein the electrode is disposed over a top surface and a sidewall of the pillar portion, and the electrode is electrically connected to the substrate through a portion of the electrode disposed over the sidewall of the pillar portion.

11. The light-emitting diode chip package as claimed in claim 4, wherein the light-emitting diode chip package comprises two pillar portions disposed at two corner regions of the substrate.

12. The light-emitting diode chip package as claimed in claim 4, wherein the light-emitting diode chip package comprises four pillar portions disposed at four corner regions of the substrate.

13. The light-emitting diode chip package as claimed in claim 1, further comprising:
    a rectangular portion disposed over the substrate, wherein the at least two electrodes are disposed over the rectangular portion.

14. The light-emitting diode chip package as claimed in claim 13, further comprising:
    wherein a height difference between a top surface of the electrode disposed over the rectangular portion and a top surface of the fluorescent sheet ranges from about 0 μm to about 50 μm.

15. A light-emitting diode chip package, comprising:
    a substrate;
    a light-emitting diode chip set (LED chip set) disposed over the substrate, wherein the LED chip set is formed by wafer level chip scale packaging, wherein the LED chip set comprises a semiconductor substrate and a plurality of LED chips formed in the semiconductor substrate;
    at least two electrodes disposed over the substrate and electrically connected to the LED chip set; and
    a fluorescent sheet disposed over the LED chip set.

16. The light-emitting diode chip package as claimed in claim 15, wherein the plurality of LED chips are electrically connected to each other by a wire in the semiconductor substrate.

17. The light-emitting diode chip package as claimed in claim 15, wherein the plurality of LED chips are juxtaposed.

18. The light-emitting diode chip package as claimed in claim 15, further comprising:
    at least one pillar portion disposed over the substrate, wherein at least one of the electrodes is disposed over the at least one pillar portion.

19. The light-emitting diode chip package as claimed in claim 18,
    wherein a height difference between a top surface of the electrode disposed over the pillar portion and a top surface of the fluorescent sheet ranges from about 0 μm to about 50 μm.

20. The light-emitting diode chip package as claimed in claim 19, wherein a height of the top surface of the electrode disposed over the pillar portion is equal to that of the top surface of the fluorescent sheet.

21. The light-emitting diode chip package as claimed in claim 18, wherein each of the pillar portions comprises a conductive via, wherein the conductive via electrically connects the electrode and the substrate.

22. The light-emitting diode chip package as claimed in claim 21, wherein the LED chip set is electrically connected to the at least two electrodes by a conductive layer disposed in or disposed over the substrate.

23. The light-emitting diode chip package as claimed in claim 18, wherein the LED chip set is electrically connected to the at least two electrodes by a solid wire.

24. The light-emitting diode chip package as claimed in claim 18, wherein the electrode is disposed over a top surface and a sidewall of the pillar portion, and the electrode is electrically connected to the substrate through a portion of the electrode disposed over the sidewall of the pillar portion.

25. The light-emitting diode chip package as claimed in claim 18, wherein the light-emitting diode chip package comprises two pillar portions disposed at two corner regions of the substrate.

26. The light-emitting diode chip package as claimed in claim 18, wherein the light-emitting diode chip package comprises four pillar portions disposed at four corner regions of the substrate.

27. The light-emitting diode chip package as claimed in claim 15, further comprising:
   a rectangular portion disposed over the substrate, wherein the at least two electrodes are disposed over the rectangular portion.

28. The light-emitting diode chip package as claimed in claim 27, further comprising:
   wherein a height difference between a top surface of the electrode disposed over the rectangular portion and a top surface of the fluorescent sheet ranges from about 0 µm to about 50 µm.

29. A light-emitting diode chip package, comprising:
   a substrate;
   a light-emitting diode chip set (LED chip set) disposed over the substrate, wherein the LED chip set is formed by a plurality of light-emitting diode chips (LED chips) in one piece, wherein the LED chip set comprises a semiconductor substrate, and the plurality of LED chips are formed in the semiconductor substrate; and
   at least two electrodes disposed over the substrate and electrically connected to the LED chip set,
   wherein the plurality of LED chips are juxtaposed.

30. A light-emitting diode chip package, comprising:
   a substrate;
   a light-emitting diode chip set (LED chip set) disposed over the substrate, wherein the LED chip set is formed by a plurality of light-emitting diode chips (LED chips) in one piece, wherein the LED chip set comprises a semiconductor substrate, and the plurality of LED chips are formed in the semiconductor substrate;
   at least two electrodes disposed over the substrate and electrically connected to the LED chip set; and
   at least one pillar portion disposed over the substrate, wherein at least one of the electrodes is disposed over the at least one pillar portion,
   wherein each of the pillar portions has a conductive via formed therein, wherein the conductive via electrically connects the electrode and the substrate.

\* \* \* \* \*